United States Patent
Kennedy et al.

(10) Patent No.: US 10,131,988 B2
(45) Date of Patent: Nov. 20, 2018

(54) SLIDING ELEMENT, IN PARTICULAR PISTON RING, AND COMBINATION OF A SLIDING ELEMENT WITH A MATING RUNNING ELEMENT

(75) Inventors: Marcus Kennedy, Dusseldorf (DE); Michael Zinnabold, Burscheid (DE)

(73) Assignee: Federal-Mogul Burscheid GmbH, Burscheid (DE)

( * ) Notice: Subject to any disclaimer, the term of this patent is extended or adjusted under 35 U.S.C. 154(b) by 38 days.

(21) Appl. No.: 13/505,308

(22) PCT Filed: Aug. 19, 2010

(86) PCT No.: PCT/EP2010/062096
§ 371 (c)(1),
(2), (4) Date: Aug. 6, 2012

(87) PCT Pub. No.: WO2011/051008
PCT Pub. Date: May 5, 2011

(65) Prior Publication Data
US 2013/0042845 A1    Feb. 21, 2013

(30) Foreign Application Priority Data

Nov. 2, 2009 (DE) .................. 10 2009 046 281

(51) Int. Cl.
*F02B 75/08* (2006.01)
*C23C 16/26* (2006.01)
(Continued)

(52) U.S. Cl.
CPC ............ *C23C 16/26* (2013.01); *C23C 16/029* (2013.01); *C23C 16/0272* (2013.01); *C23C 28/044* (2013.01); *C23C 28/046* (2013.01)

(58) Field of Classification Search
USPC .......................................... 123/668; 277/443
See application file for complete search history.

(56) References Cited

U.S. PATENT DOCUMENTS 5,618,590 A  *  4/1997  Naruse ................ C23C 14/0688
                                                         204/192.16
8,201,831 B2     6/2012  Hoppe et al.
(Continued)

FOREIGN PATENT DOCUMENTS

DE            29605666 U1    7/1996
DE      10 2005 063123 B3    5/2007
(Continued)

OTHER PUBLICATIONS

A. Hieke et al., "Comparison Between WCC/DLC, CrN/DLC and RF Produced DLC Coatings," 48th Annual Technical Conference Proceedings (2005) ISSN 0737-5921, Society of Vacuum Coaters.
(Continued)

*Primary Examiner* — Lindsay Low
*Assistant Examiner* — Ruben Picon-Feliciano
(74) *Attorney, Agent, or Firm* — Robert L. Stearns; Dickinson Wright, PLLC

(57) ABSTRACT

A sliding element, such as a piston ring, for use in diesel or highly supercharged spark-ignition engines with iron-based mating running elements is provided. The sliding element includes a base material made of cast iron or steel and a coating. The coating includes a CrN layer, an $Me(C_xN_y)$ layer, and a DLC layer extending from the inside to the outer side respectively. The DLC layer consists of a metal-containing substructure layer and a metal-free DLC top layer. The $Me(C_xN_y)$ layer is crystalline and Me is tungsten (W), chromium (Cr), or Silicon (Si). The hardness of the metal-free DLC top layer is harder than the metal-containing substructure layer.

19 Claims, 2 Drawing Sheets

(51) Int. Cl.
  *C23C 16/02*   (2006.01)
  *C23C 28/04*   (2006.01)

(56) References Cited

U.S. PATENT DOCUMENTS

| | | | |
|---|---|---|---|
| 2007/0059529 A1* | 3/2007 | Hosenfeldt | C23C 14/0605 428/408 |
| 2008/0136116 A1* | 6/2008 | Sarabanda et al. | 277/443 |
| 2008/0220257 A1* | 9/2008 | Dekempeneer | 428/408 |
| 2009/0001669 A1* | 1/2009 | Hoppe | F16J 9/26 277/442 |
| 2009/0029132 A1* | 1/2009 | Garcia | C23C 16/0218 428/216 |
| 2009/0278320 A1* | 11/2009 | Araujo et al. | 277/442 |
| 2010/0051096 A1 | 3/2010 | Kim et al. | |
| 2011/0101620 A1 | 5/2011 | Hoppe et al. | |

FOREIGN PATENT DOCUMENTS

| | | |
|---|---|---|
| DE | 102008016864 B3 | 10/2009 |
| EP | 905419 A2 | 3/1999 |
| EP | 0971048 A1 | 1/2000 |
| JP | H11172413 A | 6/1999 |
| JP | 2004169137 A | 6/2004 |
| JP | 2006283970 A | 10/2006 |
| RU | 2276199 C2 | 5/2006 |
| RU | 2347866 C2 | 2/2009 |
| SU | 787705 A1 | 3/1979 |
| SU | 1390410 A1 | 4/1988 |
| WO | WO 2005/106065 A1 | 11/2005 |
| WO | WO 2006/125683 A1 | 11/2006 |
| WO | 2007020139 A1 | 2/2007 |
| WO | 2008000573 | 1/2008 |
| WO | WO 2008/131837 A2 | 11/2008 |
| WO | WO 2009/106201 A1 | 1/2009 |

OTHER PUBLICATIONS

Vakuum-Beschichtung und Plasma-Oberflachentechnik 2009, Workshop Beschichtungen fur Werkzeuge und Bauteile, http://www.v2009.net/w2-programm.html viewed Feb. 17, 2011. October 2009.
Becker et al., "Komponentenbeschichtung fur die Automobilindustrie" Oct. 2009, Oerlikon Balzers Coating Germany GmbH.
"Kolbenring," Wikipedia, http://de.wikipedia.org/wiki/Kolbenring viewed Feb. 17, 2011, pp. 1-3.
"Kohlenstoffschict," Wikipedia, http://de.wikipedia.org/wiki/Kohlenstoffschict viewed Feb. 17, 2011, pp. 1-2.
Calculator Conversion Between Vickers Hardness Number and SI Units MPa and GPa, http://www.gordonengland.co.uk/hardness/hvconv.htm viewed Feb. 21, 2011.
Gerrit Jan Van Der Kolk et al., "DLC-Beschichtungen fur hochbelastete Komponenten," V2009 Workshop Beschichtungen fur Werkzeuge und Bauteile Di. den Oct. 20, 2009, IonBond Niederlande, Venlo.
"Roverdrive Feb. 2004," Roverfreunde Deutschland e.V., http://www.rover-freunde.de/rfmgh170dt.html viewed Feb. 21, 2011.
Portions of Notice of Opposition to DE 10 2009 046 281 B3 submitted to the German Patent and Trademark Office by the law firm Winter Lewandowsky on behalf of Mahle International GmbH, dated Feb. 23, 2011.
Portions of Notice of Opposition to DE 10 2009 046 281 B3 submitted to the German Patent and Trademark Office by the law firm nospat on behalf of Oerlikon Trading AG, dated Feb. 22, 2011.
Polyak M.S., Hardening Tecnology, Moscow, Mashinostroyeniye, 1995, vol. 1, p. 12, paragraphs 2-1 from below, p. 13.
Novikov I.I. et al, Extractive Metallurgy, M. MISiS, 2008, p. 336, paragraph 1 from below, p. 337.

\* cited by examiner

SLIDING ELEMENT, IN PARTICULAR PISTON RING, AND COMBINATION OF A SLIDING ELEMENT WITH A MATING RUNNING ELEMENT

BACKGROUND OF THE INVENTION

1. Technical Field

The invention relates to a sliding element, in particular a piston ring, comprising a coating and a combination of a sliding element with a mating running element.

2. Related Art

Numerous technical applications entail sliding elements in sliding contact with mating running elements. The combination of a piston ring with a cylinder liner can be considered to be a typical application. If the cylinders or cylinder liners are, for example, made of aluminum-silicon alloys, which is in particular the case with spark-ignition engines, DLC (diamond like carbon) coating systems have proven their worth with respect to wear and friction loss. However, known DLC layer systems need to be improved with respect to service life and suitability for use with diesel or highly supercharged spark-ignition engines which usually have iron-based cylinder liners. Due to the significantly higher cylinder pressures and in particular in combination with direct injection, there is a greater proportion of mixed friction conditions. The decisive factor for the inadequate suitability of DLC coating systems for situations of this kind is considered to be the low layer thickness which is usually less than 5 μm.

RELATED ART

DE 10 2005 063 123 B3 discloses a DLC coating with a run-in layer. With respect to higher layer thicknesses, PVD coatings are also known, in particular based on CrN with layer thicknesses of 10-30 μm. Although these do result in an improved service life, there is a deterioration in the friction loss and resistance to wear, in particular in the case of insufficient lubrication and scuff resistance. On the other hand, due to their amorphous structure, DLC layer systems have the advantage that they are substantially chemically inactive with metal surfaces and hence have an extremely low adhesion tendency with respect to the mating running element.

DE 296 05 666 U1 relates to a component in the region of an internal combustion engine coated with a metal-free, amorphous carbon layer with graduated hardness over the layer thickness.

DE 10 2008 016 864 B3 discloses a piston ring comprising an adhesive layer, a metal-containing amorphous carbon layer and a metal-free amorphous carbon layer extending from the inside to the outer side.

WO 2009/106201 A1 relates to a component of an internal combustion engine, with which a DLC coupling agent layer, a DLC functional layer and a DLC run-in layer are present on a substrate.

Finally, WO 2006/125683 A1 discloses a piston ring comprising a layer with an element from the groups IVB, VB or VIB, an intermediate layer with a diamond-like nanocomposite composition and a DLC layer extending from the inside to the outer side.

US 2008/0220257 A1 relates to a coating on a metal substrate having an adhesive layer, a carbon layer with a tetrahedral structure and an amorphous carbon layer extending from the inside to the outer side.

SUMMARY OF THE INVENTION

The invention is based on the object of providing a sliding element, in particular a piston ring, which in particular when used in diesel or highly supercharged spark-ignition engines with, for example, iron-based mating running elements, fulfils the requirements with respect to service life and friction loss. It will also disclose a suitable combination of a sliding element with mating running element.

This sliding element is characterized, on the one hand, by a combination of a CrN layer and a DLC layer on the outer side. The DLC layer is either metal-free or comprises a metal-containing substructure and a metal-free DLC top layer. In other words, the DLC layer is at least partially metal-free and, in particular on the outer surface, comprises a metal-free DLC layer. Moreover, extensive tests have shown that the coating described displays particularly good characteristics if a $Me(C_xN_y)$ layer is provided as an intermediate layer between the CrN layer and the DLC layer. Tests with this layer structure have shown that the wear characteristics on the sliding element, in particular a piston ring, are improved compared with the known structure comprising a Cr adhesive layer and a DLC top layer. This can significantly improve the service life. Tests have also shown that it is also possible to significantly reduce the relative coefficient of friction.

Hence, overall, the described layer structure can provide an improved sliding element. It is stressed that the CrN layer is preferably applied to the basic piston material without an adhesive layer, for example by metal vapour deposition or sputtering. However, in special applications, the CrN layer can be applied to the basic material of the sliding element by means of an adhesive layer.

For the sake of clarity, it should be noted that Me stands for metal and this can be, for example, tungsten, chromium, titanium or silicon. In addition, carbon and nitrogen can be present in the described layer in virtually any proportion, that is both x and y can be within the range of 0-99 atom %. In addition, in particular at least in regions, the coating can be provided on in particular at least one running surface. In addition, the coating can extend into the transition to surfaces and to surfaces adjacent to the running surfaces. This relates, for example, to the running edges of a piston ring.

Values of 1100-1900 HV 0.002 have been found to be suitable for the hardness of the CrN layer or the substructure. This embodiment can be combined with a hardness of the metal-free DLC layer of 1700-2900 HV 0.002 and/or a hardness of the metal-containing DLC layer of 800-1600 HV 0.002.

It is also expected that particularly good properties of the DLC-layer, in particular the metal-containing and/or the metal-free DLC layer, will be obtained if it contains hydrogen.

The metal-containing DLC layer can also in an advantageous way comprise nanocrystalline metal carbide precipitations, such as, for example, WC, CrC, SiC, GeC or TiC.

Advantageous properties have also been identified for CrN layers with a thickness of 1-30 μm, $Me(C_xN_y)$ layers with a thickness of a maximum of 2 μm and an overall layer thickness of 5-40 μm.

With respect to the roughness, to further improve the properties, it is preferable for the top layer forming the surface to have roughness parameters Rz<5 μm and/or Rpk<0.8 μm.

In a proven way, the metal-containing and/or metal-free DLC layer can be produced by PA-CVD methods.

The invention also relates to a combination of at least one sliding element as described above with a mating running element, in particular a cylinder or a cylinder liner of an internal combustion engine, in particular a diesel or highly supercharged spark-ignition engine, wherein the mating running element is iron-based.

BRIEF DESCRIPTION OF THE DRAWINGS

The following describes a preferred exemplary embodiment with reference to the drawings, which show.

DETAILED DESCRIPTION

Figure 1:
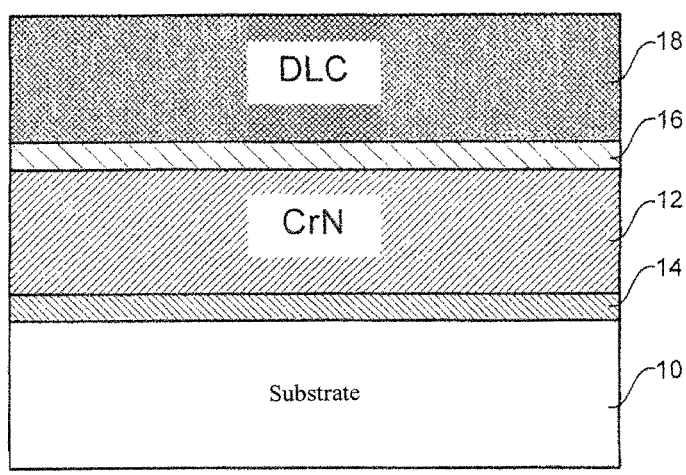
FIG. 1 a layer structure according to the invention

As FIG. 1 shows, a CrN layer 12 is applied to the basic material 10 of the sliding element. The adhesive layer 14 shown in FIG. 1 does not necessarily have to be provided. In particular, this is preferably omitted. By means of a Me($C_xN_y$) intermediate layer 16, a DLC layer 18 is provided on the outer side with a metal-free DLC layer on the outer side.

Tests with comparative examples were performed with a structure of this kind, without the adhesive layer 14. The table shows the layer systems.

| | Layer structure | | | | |
|---|---|---|---|---|---|
| | Substrate Adhesive layer | Substructure | Intermediate layer | Running surface Top layer | Total layer thickness [μm] |
| DLC series | Cr | | | DLC | 3.5 |
| CNDLC01 | — | CrN - 01 | Me(CN)x | DLC | 8.8 |
| CNDLC02 | Cr | CrON - 02 | Cr | DLC | 14.5 |
| CNDLC03 | Cr | Cr—N - 03 | Cr | DLC | 14.6 |
| CNDLC04 | Cr | CrON - 04 | Cr | DLC | 14.3 |

Figure 2:
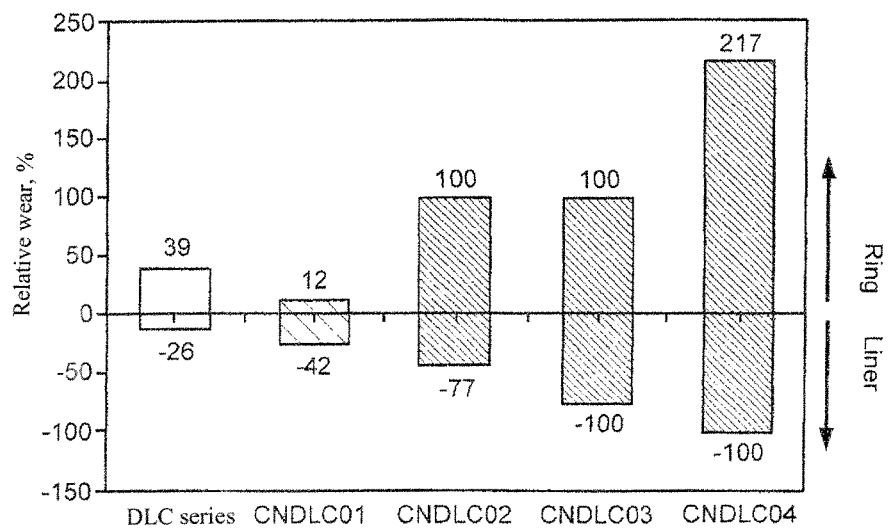
FIG. 2 the relative wear on a piston ring and a cylinder liner.

Here, the system "DLC series" is a standard DLC layer system without CrN. These layer systems were applied to a piston ring, and the tribological behavior investigated in combination with a honed cast iron cylinder liner in lubricated condition. FIG. 2 shows the relative wear values for the piston ring (at the top) and for the cylinder liner. The percentage values shown indicate the percentage of the original DLC layer remaining after the end of the test. If this value is more than 100 percent, in addition to the DLC layer, the CrN or CrON layer is also at least partially worn. The highest wear value is used as the reference value for the relative wear of the cylinder liner and hence defined as 100 percent.

As FIG. 2 shows, the coating according to the invention with a Me($C_xN_y$) intermediate layer has the lowest relative wear. In the case of wear to the cylinder liner, only the known DLC coating results in a lower value. However, the wear of the cylinder liner is also in an acceptable range for the example according to the invention.

Figure 3:
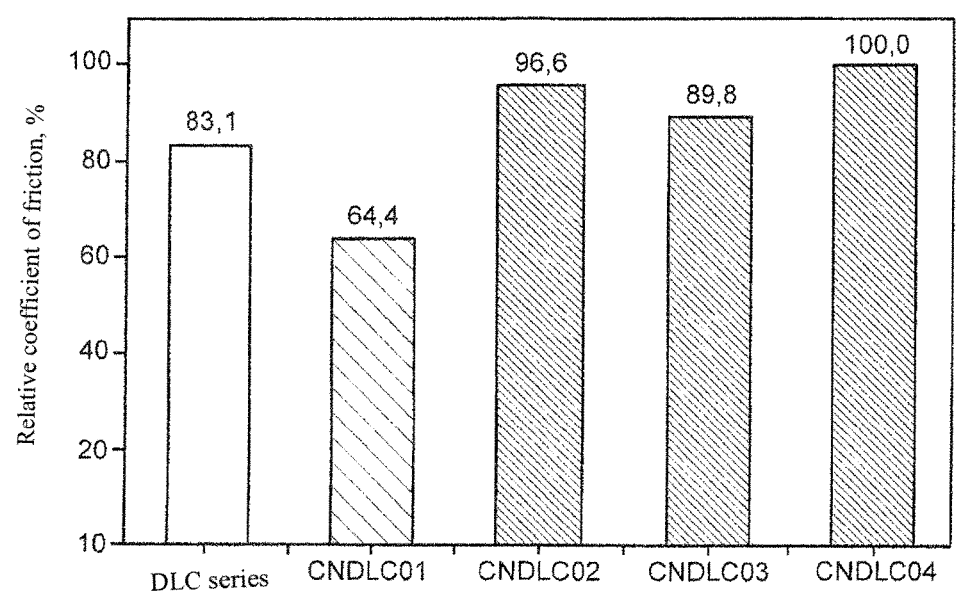
FIG. 3 the relative coefficient of friction of different layer systems.

Investigations were also performed into the coefficients of friction and the results are shown in FIG. 3. Here the example according to the invention has the lowest relative coefficient of friction. Hence, this requirement is also fulfilled in addition to the requirement for comparatively low wear and hence a long service life.

The invention claimed is:

1. A sliding element having a base material made of cast iron or steel and comprising a coating having a CrN layer, an Me($C_xN_y$) layer and a DLC layer extending from the inside to the outer side respectively, wherein the DLC layer consists of a metal-containing substructure layer and a metal-free DLC top layer, the Me($C_xN_y$) layer is crystalline and Me is tungsten (W), chromium (Cr), or Silicon (Si), the hardness of the metal-free DLC top layer being harder than the metal-containing substructure layer, wherein hardness of the metal-free DLC top layer is 1700-2900 HV 0.002, and the hardness of the CrN layer is 1100-1900 HV 0.002.

2. The sliding element according to claim 1 wherein the metal-containing substructure layer contains hydrogen.

3. The sliding element according to claim 1, wherein the metal-containing substructure layer contains nanocrystalline metal carbide precipitations.

4. The sliding element according to claim 1, wherein the CrN layer has a thickness of 1-30 μm.

5. The sliding element according to claim 1, wherein the outer side of the DLC layer has a roughness of Rz<5 μm.

6. The sliding element according to claim 1, wherein the CrN layer is metal-vapour deposited.

7. The sliding element according to claim 1, wherein the hardness of the metal containing substructure layer is 800-1600 HV 0.002.

8. The sliding element according to claim 1, wherein the metal-free DLC top layer contains hydrogen.

9. The sliding element according to claim 3, wherein the precipitates are selected form the group consisting of at least one of WC, CRC, SiC, GeC or TiC.

10. The sliding element according to claim 1, wherein the Me($C_xN_y$) layer has a maximum thickness of 2 μm.

11. The sliding element according to claim 1, wherein the coating has a thickness of 5-40 μm.

12. The sliding element according to claim 1 wherein the outer side of the DLC layer has a roughness of Rpk<0.8 μm.

13. The sliding element according to claim 1, wherein the metal-containing substructure layer is produced by PA-CVD process.

14. The sliding element according to claim 1, wherein the metal-free DLC top layer is produced by PA-CVD process.

15. The sliding element according to claim 1, wherein the sliding element comprises a piston ring.

16. The sliding element according to claim 15, wherein the sliding element comprises an iron-based mating cylinder liner.

17. The sliding element according to claim 1, wherein the sliding element comprises a piston ring or iron-based mating cylinder liner;
the coating has a thickness of 5-40 μm;
the CrN layer is metal-vapour deposited and has a thickness of greater than 1 μm and up to 30 μm;
the Me($C_xN_y$) layer has a maximum thickness of 2 μm;
the metal-containing substructure layer contains hydrogen and nanocrystalline metal carbide precipitations and has a hardness of 800-1600 HV 0.002;
the metal-free DLC top layer contains hydrogen; and
the outer side of the DLC layer has a roughness of Rz<5 μm and Rpk<0.8 μm.

18. The sliding element according to claim 17, wherein the precipitations are selected form the group consisting of at least one of WC, CRC, SiC, GeC or TiC.

19. The sliding element according to claim 1, wherein the Me of the Me($C_xN_y$) layer is tungsten (W) or Silicon (Si).

* * * * *